(12) United States Patent
Hunt et al.

(10) Patent No.: US 10,707,051 B2
(45) Date of Patent: Jul. 7, 2020

(54) CATHODOLUMINESCENCE OPTICAL HUB

(71) Applicant: Gatan, Inc., Pleasanton, CA (US)

(72) Inventors: John Andrew Hunt, Fremont, CA (US); Michael Bertilson, Dublin, CA (US); Tom Worsley, Chipping Norton (GB)

(73) Assignee: Gatan, Inc., Pleasanton, CA (US)

( * ) Notice: Subject to any disclaimer, the term of this patent is extended or adjusted under 35 U.S.C. 154(b) by 0 days.

(21) Appl. No.: 16/408,703

(22) Filed: May 10, 2019

(65) Prior Publication Data

US 2019/0348257 A1 Nov. 14, 2019

Related U.S. Application Data (60) Provisional application No. 62/671,152, filed on May 14, 2018.

(51) Int. Cl.
*G02B 21/06* (2006.01)
*H01J 37/22* (2006.01)
*H01J 37/26* (2006.01)

(52) U.S. Cl.
CPC ............ *H01J 37/261* (2013.01); *G02B 21/06* (2013.01); *H01J 37/22* (2013.01)

(58) Field of Classification Search
CPC .......... H01J 37/22; H01J 37/26; H01J 37/261; H01J 37/28; G02B 21/00; G02B 21/06; G02B 21/08; G01J 3/02
See application file for complete search history.

(56) References Cited

U.S. PATENT DOCUMENTS

| 6,885,445 B2* | 4/2005 | Bennett ..................... G01J 3/02 356/301 |
| 2003/0053048 A1 | 3/2003 | Bennett et al. |
| 2007/0023655 A1* | 2/2007 | Nishikata .............. H01J 37/228 250/310 |
| 2018/0158647 A1* | 6/2018 | Niu ........................ H01J 37/226 |

FOREIGN PATENT DOCUMENTS

| EP | 1 956 632 A1 | 8/2008 |
| WO | 2016/036250 A1 | 3/2016 |

* cited by examiner

*Primary Examiner* — David E Smith
(74) *Attorney, Agent, or Firm* — Snyder, Clark, Lesch & Chung, LLP (57) ABSTRACT

An apparatus for collection, distribution, and analysis of cathodoluminescence (CL) and other light signals in an electron microscope is provided. The optical hub, utilizing a linear-translating fold-mirror and mounted to the electron microscope, is used to receive essentially collimated light collected from a collection-mirror and efficiently route the collected light to a plurality of light-analysis instruments. The linear-translating fold-mirror can provide fine positional alignment of the light signal, and in an aspect of the invention can be used to select or scan a portion of the collected light-pattern into an optical slit or aperture. In one aspect, the optical hub includes a light filter mechanism that can track the movement of the fold-mirror. In an aspect, the optical hub also controls the positioning of the collection-mirror in proximity to the specimen being analyzed.

14 Claims, 7 Drawing Sheets

CATHODOLUMINESCENCE OPTICAL HUB

CROSS-REFERENCE TO RELATED APPLICATION

The present application claims priority to U.S. Provisional Patent Application No. 62/671,152, filed May 14, 2018, the entirety of which is hereby incorporated by reference herein.

BACKGROUND

When a high-energy charged particle, such as an electron or ion beam strikes a sample, photons can be emitted depending on the sample material. This phenomena is known as cathodoluminescence (CL). The collection and detection of these photons in the wavelength range from ultraviolet (UV) through visible to infrared (IR), can provide a wealth of information about the sample under investigation. CL is typically examined with the sample in an electron microscope and collected by directing the photons to, for example a light sensor, image array or spectroscopy equipment, any or all of which may be located outside the electron microscope beam column. The inside of the electron microscope beam column is kept at low pressures so the electrons can travel to the sample without significant scattering by gas in the beam column. After the light is collected, it can be transmitted from the low-pressure environment, through an optical window, and into instruments that analyze the CL light.

A common way to collect photons emitted via CL is via a collection-mirror, which may be a paraboloid mirror, located on axis with the electron beam (e-beam) and either above (more typically) or below the sample or both above and below the sample. Where the collection-mirror is located above the sample, on axis with the e-beam, the mirror will have a hole to allow the e-beam to pass through the mirror to the sample unobstructed.

The CL signal, comprised of the emitted photons, contains much information about the sample which emits it. Analysis of the CL signal may make use of the total CL intensity, spectral information, polarization information, and angular resolved light emission. The CL signal is often weak and it is often important to preserve as much of the signal as possible for analysis. Furthermore, it is often important to have separate analysis optics and detectors, herein referred to as CL instruments that are each optimized for a specific signal. For example, if spectral information is not important for an analysis, it may be best to directly couple the collected light into a light sensor, rather than pass the light through a spectrometer, where some fraction of the light is lost, and then into a light sensor.

Aligning a CL mirror over a sample so that the focal point of the CL mirror is precisely at the spot on the sample where the electron beam strikes and the CL is emitted can be a difficult and time-consuming process. Because of this, performing more than one type of analysis on the CL light can be difficult if multiple instruments are installed on the microscope column and a CL mirror is aligned for each instrument. Multiple instruments for CL analysis may be combined, allowing the user to use the same CL collection-mirror without repositioning with respect to the sample for a plurality of measurements. One difficulty, however, with combined multiple instruments is directing the collected CL light to the different instruments with minimal loss of any information contained in the CL light, including, for example CL intensity, spectral information, polarization information, and angular resolved light emission.

DETAILED DESCRIPTION OF PREFERRED EMBODIMENTS

Those skilled in the art will recognize other detailed designs and methods that can be developed employing the teachings of the present invention. The examples provided here are illustrative and do not limit the scope of the invention, which is defined by the attached claims. The following detailed description refers to the accompanying drawings. The same reference numbers in different drawings may identify the same or similar elements.

Figure 1:
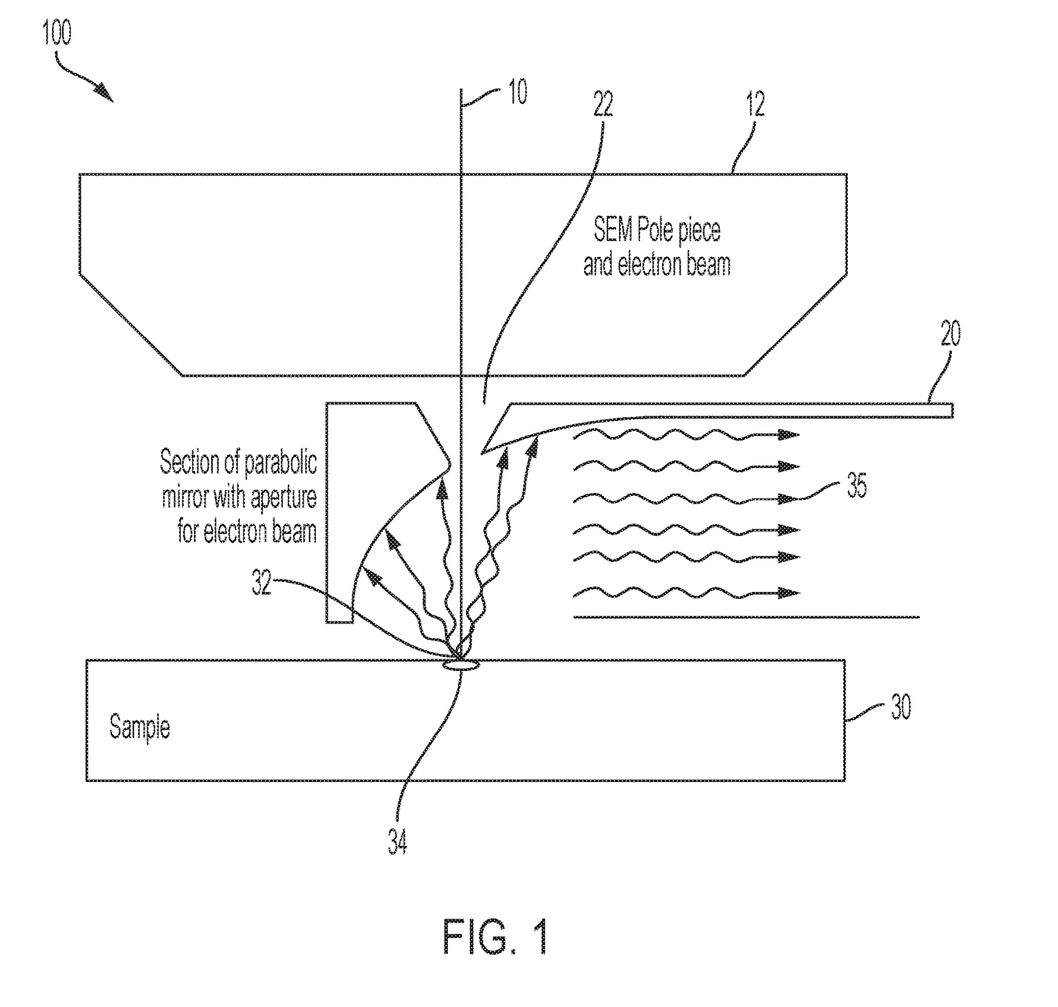
FIG. 1 is a diagram of an apparatus for collection of cathodoluminescence light in an electron microscope.

In a typical CL instrument, as shown in FIG. 1, an electron microscope 100 (not shown) produces an e-beam 10 that exits a pole piece 12 and is directed to sample 30. At the point 32 where the e-beam 10 strikes the sample 30, cathodoluminescence (CL) light 34 may be generated. A collection-mirror, 20, which may be a paraboloid mirror, is provided to reflect the CL light 34 to detectors, which may be located outside of the electron microscope 100. The collection-mirror 20 will typically have an aperture 22 to allow the e-beam 10 to pass through, since the mirror 20 may be made of a material (e.g., diamond polished aluminum) that would otherwise obstruct the e-beam. CL light 34 collected by collection mirror 20, when properly focused on the sample 30, produces a light-pattern 35 that is collimated along the exit optic axis (not labeled) of mirror 20. In a typical CL instrument, the light collected by collection-mirror 20 to is sent to different CL analysis instruments using a series of fold-mirrors and potentially optical switches to route the light-pattern 35 to the individual instruments.

Figure 2:
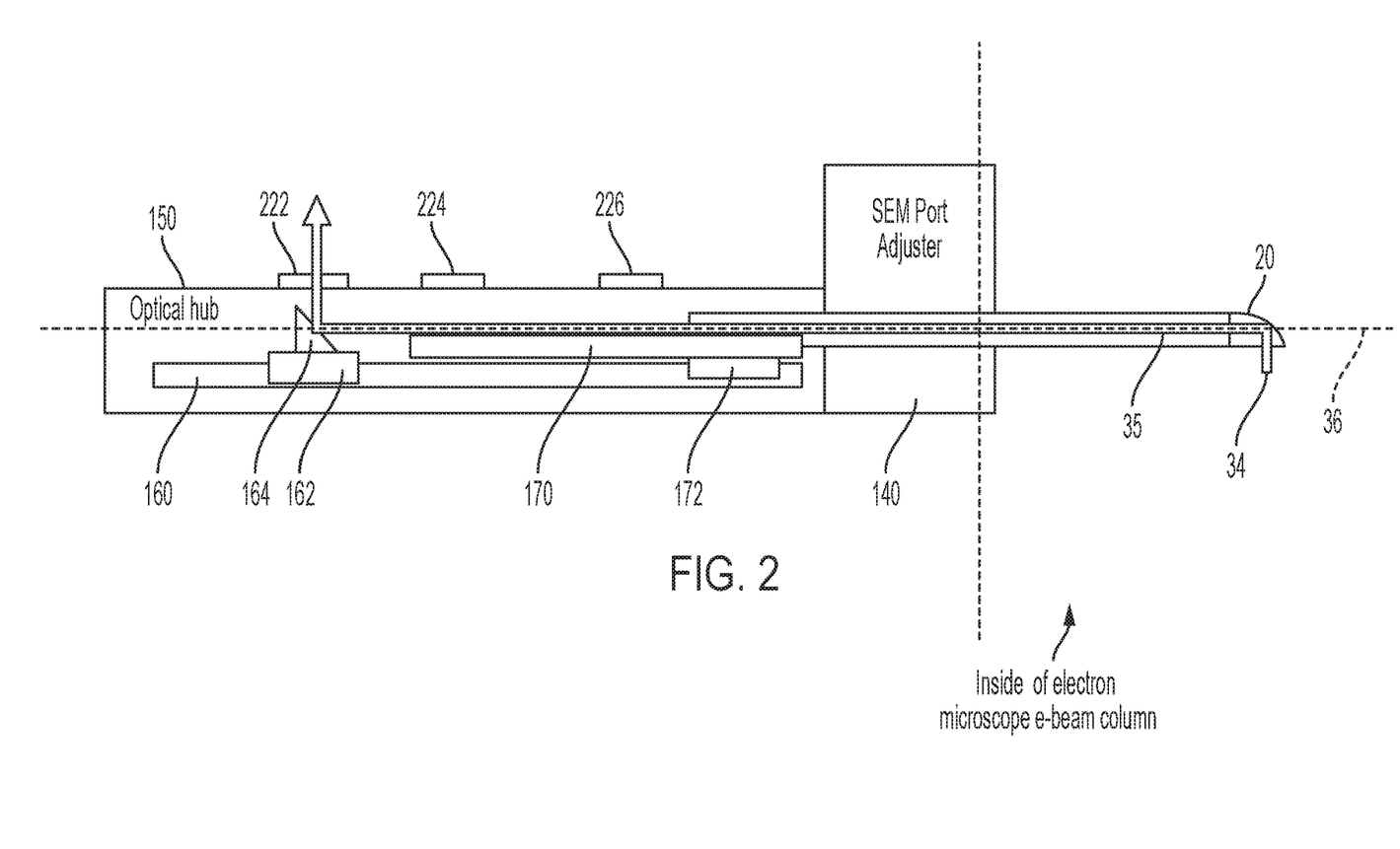
FIG. 2 is a schematic drawing of an exemplary CL optics system utilizing an optical hub design.

In an aspect of this invention, as shown in FIG. 2, an "optical hub" 150 is configured to transfer the light collected by collection-mirror 20 to different CL analysis instruments (not shown). The optical hub 150 connects to the electron microscope 100 via port adjuster 140 which may also be configured to adjust the position of optic axis 36 in the directions normal to the optic axis 36. The inside of optical hub 150 shares the same low-pressure environment as the inside of electron microscope 100. The interior components of the optical hub 150 include materials that do not "contaminate" the environment of electron microscope 100, and such that x-ray radiation produced within electron microscope 100 is safely contained within electron microscope 100 and optical hub 150. A linear actuator 160, which may include an electric-motor driven lead-screw, moves a carriage 162 parallel to optic axis 36 and such that fold-mirror 164 intercepts and re-directs the predominately collimated light-pattern 35 through optical windows 222, 224, 226 and outside of the low-pressure environment of electron microscope 100. One important advantage of this approach is that there is no fundamental limit to the number of optical windows supported, and the adjustable nature of the position of fold-mirror 164 via moving carriage 162 allows the fine alignment of the light pattern 35 into CL instruments mounted outside of the optical windows (e.g., 222, 224 and 226). Furthermore, the optical hub 150 can be easily reconfigured with different CL instruments without need to alter the optical hub (150) components. A further advantage to the optical hub approach is that fewer fold mirrors and optical switches may be required than with typical design approaches.

In a further aspect of the invention, shown in FIG. 2, a mechanism 172 is provided to support the collection-mirror 20 above sample 30. For best performance, collection-mirror 20 may be fine-positioned so that the focal point of the collection-mirror 20 is coincident with the electron microscope 100 electron beam focused on sample 30. It is also useful to be able to retract collection-mirror 20 a sufficient distance so it does not interfere with the operation of electron microscope 100 when CL photons are is being collected. Retraction and fine-positioning can be accomplished with a linear-actuator 170, which may include an electric-motor driven lead-screw that moves a mechanism 172 parallel to optic axis 36. Coordination of the motion of carriage 162 and mechanism 172 may be required to prevent collision. For example, a controller (not shown) may control movement of carriage 162 with respect to mechanism 172.

Figure 3:
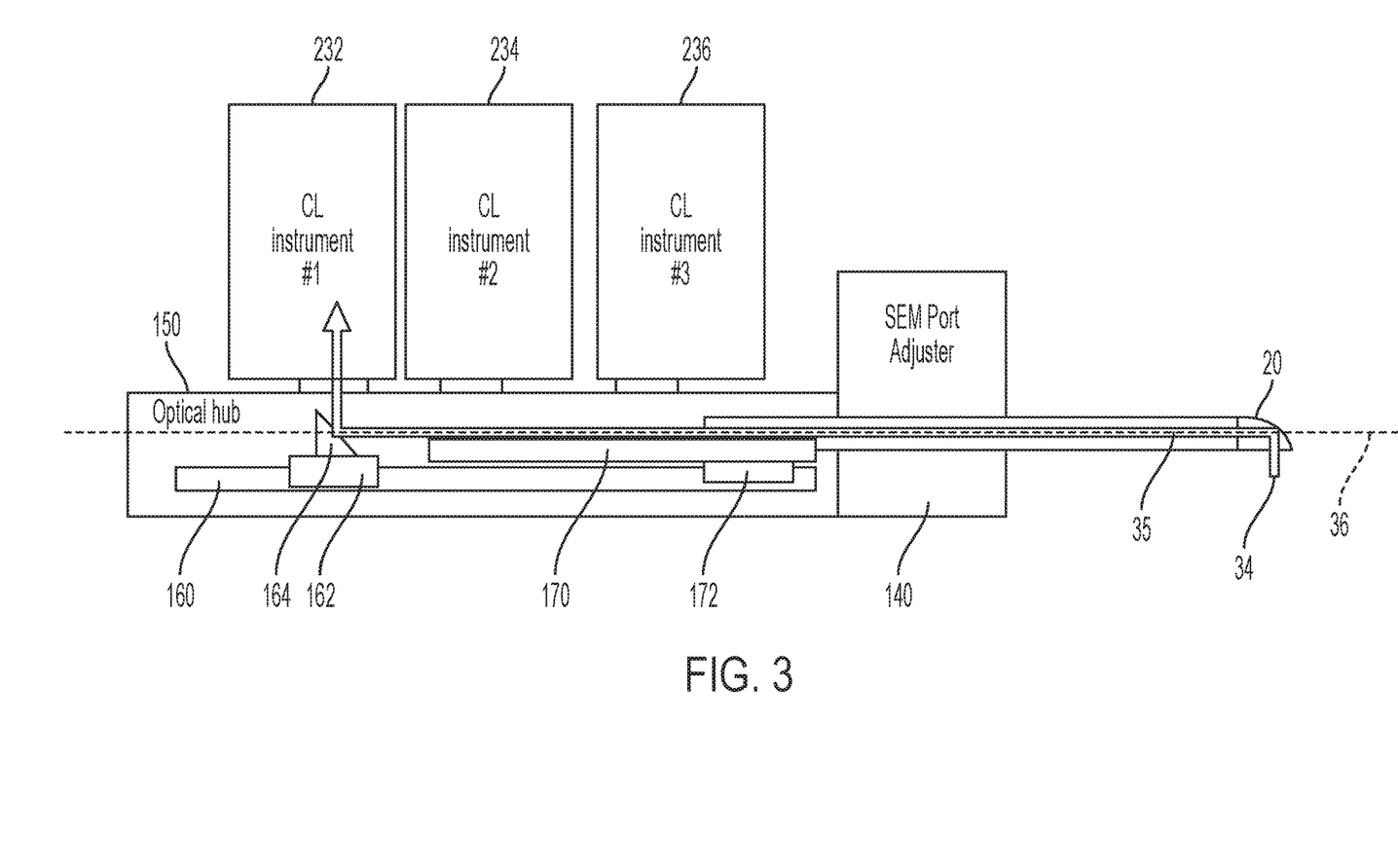
FIG. 3 is a schematic drawing of an exemplary CL optics system utilizing an optical hub design and three separate CL detection instruments.

FIG. 3 shows an exemplary CL system, having an optical hub 150 as described above, and three separate CL detection instruments 232, 234, 236 mounted above the optical hub optical windows 222, 224 and 226 (not labeled in FIG. 3). The position of fold-mirror 164 selects which instrument is able to analyze the light-pattern 35. Examples of three CL detection instruments 222, 224 and 226 that might be used are (1) an optical spectrometer to measure intensity versus wavelength, (2) a photomultiplier tube (PMT) to measure total intensity with high quantum efficiency, and (3) a camera to measure and/or capture the distribution of light in the image pattern.

Figure 4:
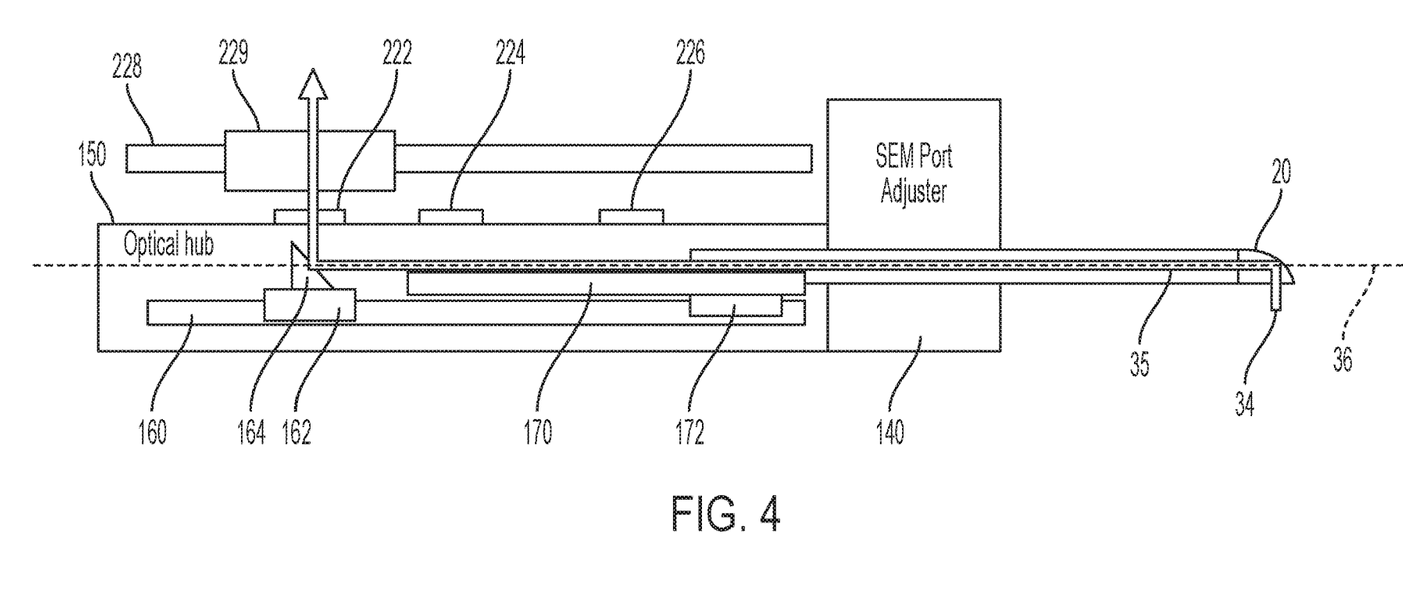
FIG. 4 is a schematic drawing of an exemplary CL optics system utilizing an optical hub design equipped with a movable filter mechanism.

In a further aspect of the invention, shown in FIG. 4, an optical filter mechanism 229 that may contain one or more optical filters or polarizers, can either be moved to intercept the light-pattern 35 after it is directed by fold-mirror 164, or can be moved out of the way of light-pattern 35. The optical filter mechanism 229 ideally can travel along axis 36 to any of the optical windows (e.g., 222, 224 and 226) and may be moved using a linear actuator 228. CL detection instruments (e.g., 222, 224, and 226) are mounted above the optical filter mechanism and are not shown in FIG. 4. The filter mechanism 229 may include a plurality of filters arranged to be remotely selectable by a filter selection actuator.

Figure 5:
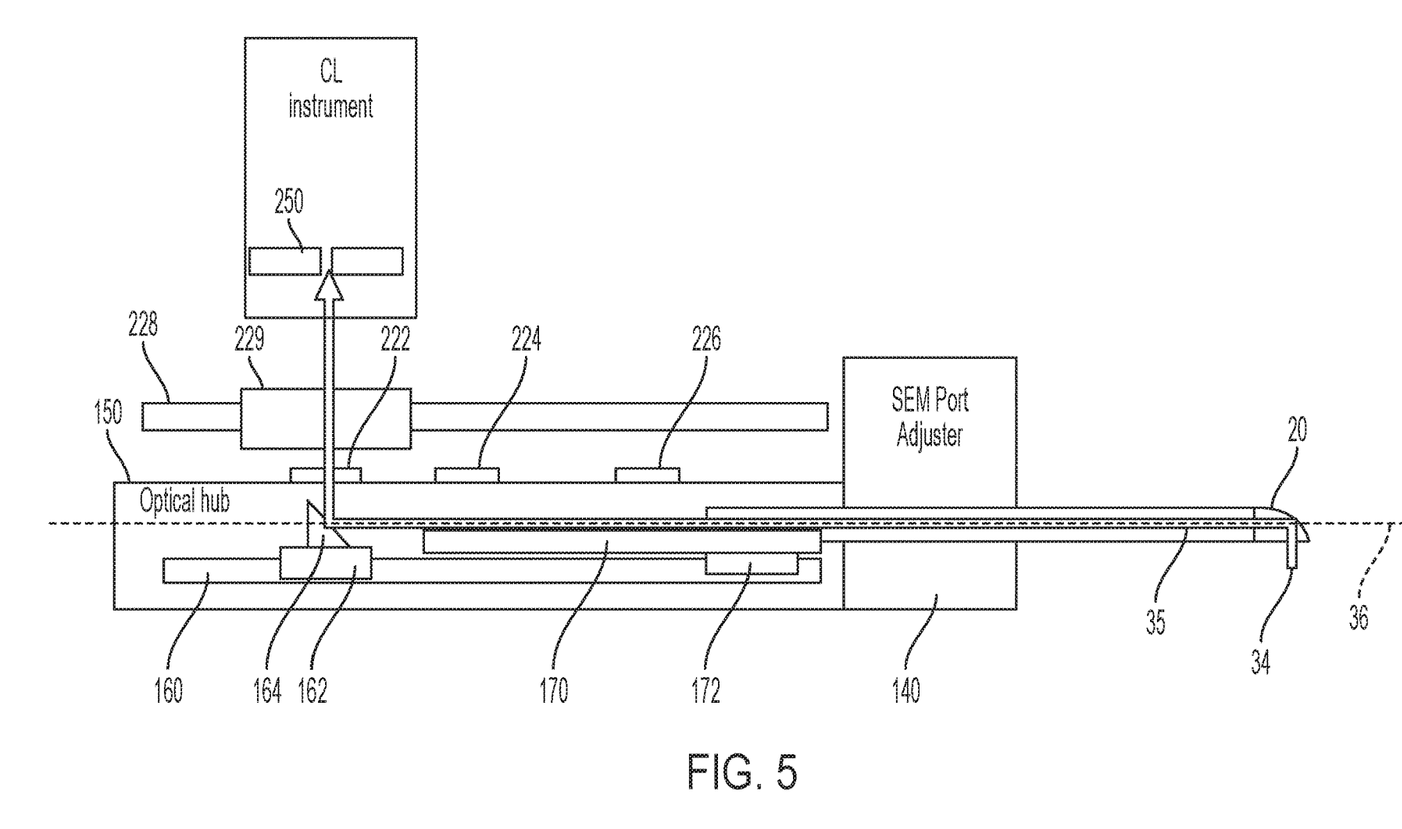
FIG. 5 is a schematic drawing of an exemplary CL optics system utilizing an optical hub design, equipped with a movable filter mechanism, and configured for fine position control of the optical hub fold-mirror to select a portion of an image pattern to be passed through an optical aperture.

In a further aspect of the invention, shown in FIG. 5, an optical aperture 250, which may be either a slit or a hole inside a CL detection instrument (e.g., one of instruments 222, 224, or 226), is configured to restrict a portion of light-pattern 35 that is permitted to travel past the optical aperture 250. The adjustable nature of the position of fold-mirror 164 allows the fine positioning of the light-pattern 35 onto optical aperture 250, so that the portion of light-pattern 35 that passes through the aperture 250 may be adjusted. This capability may optionally be combined with use of optical filter mechanism 229.

Figure 6:
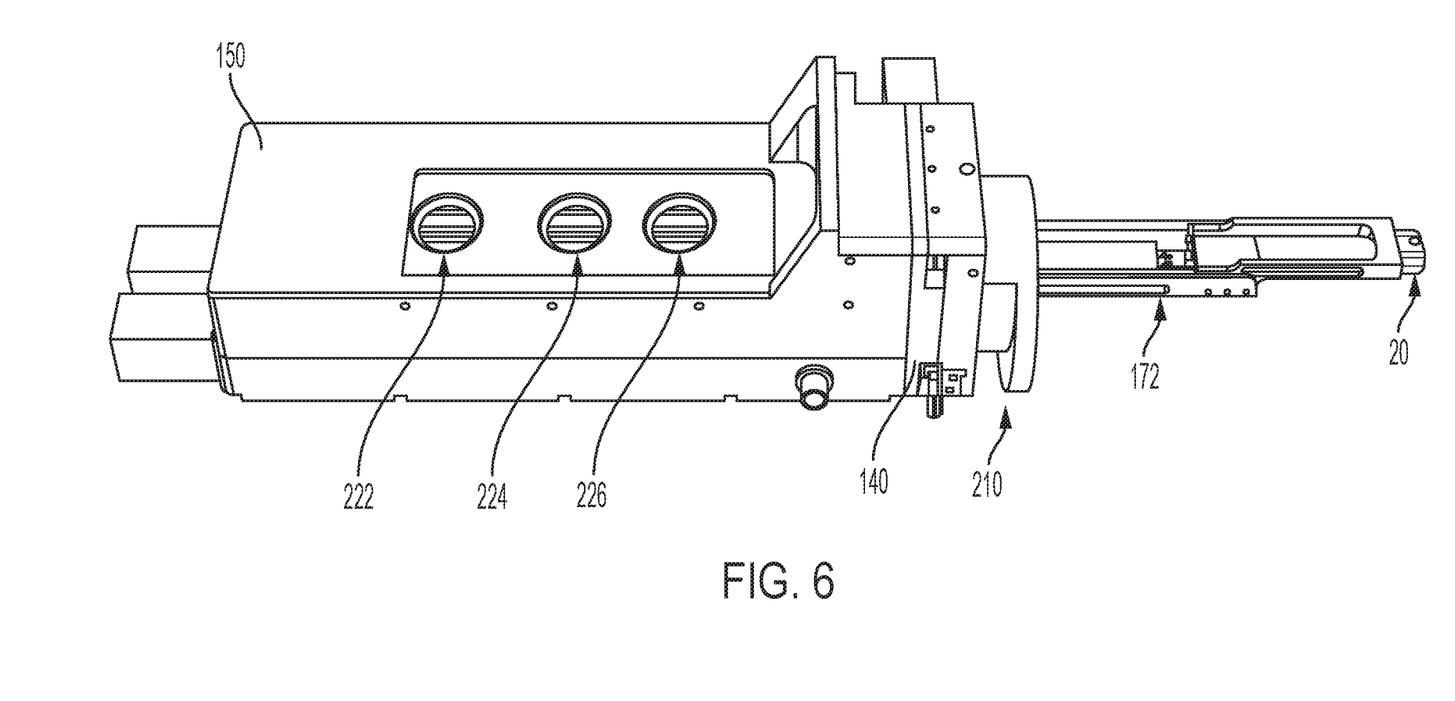
FIG. 6 is an isometric drawing of an exemplary CL optical hub.

FIG. 6 is an isometric drawing of an optical hub 150 according to an aspect of the invention. The optical hub 150 mounts to an electron microscope (not shown) at a mounting flange 210 via port adjuster 140. The optical hub 150 includes a collection mirror 20 and mirror-support mechanism 172.

Figure 7:
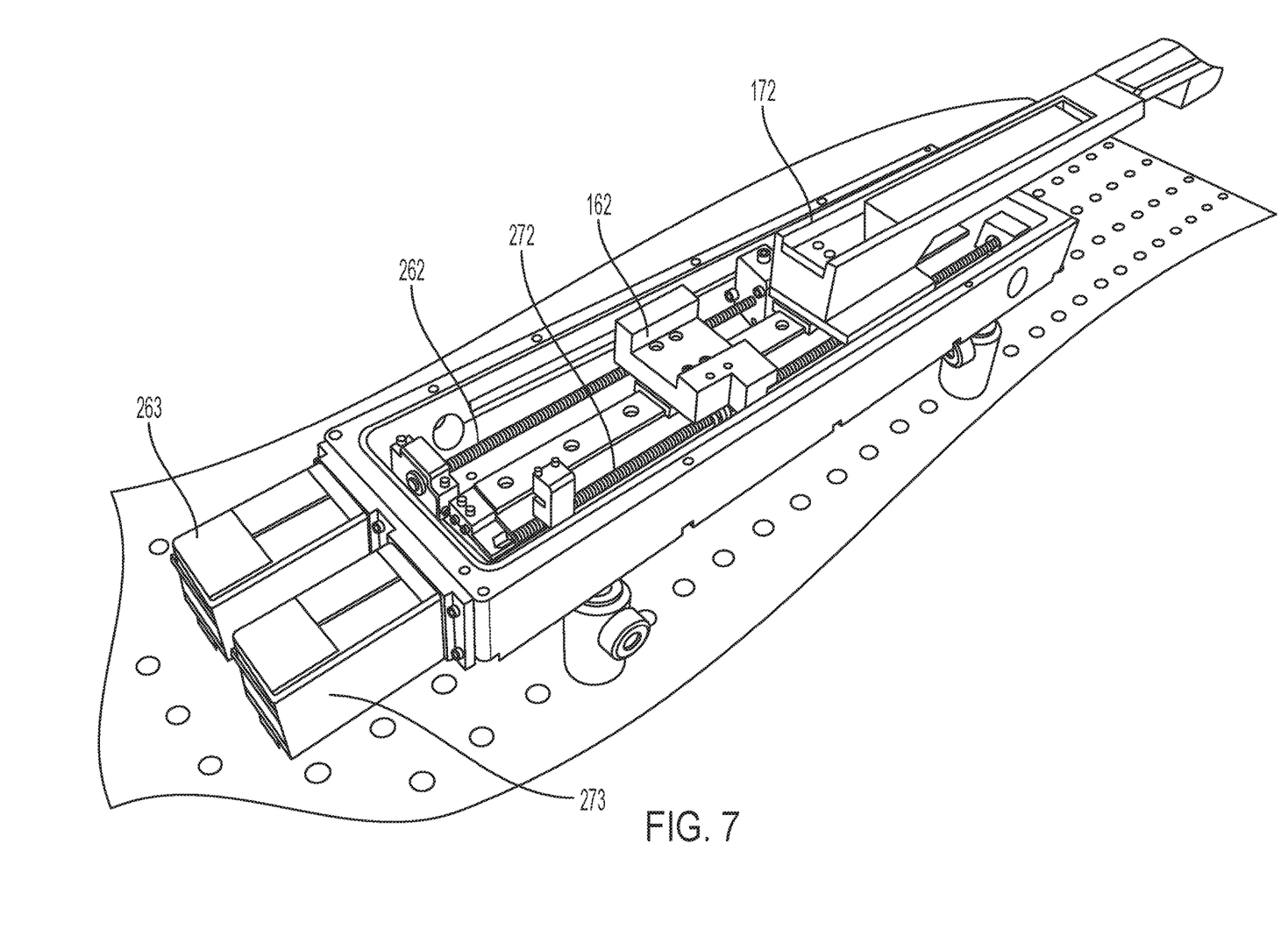
FIG. 7 shows the internal assembly of an optical hub according to an aspect of the invention.

FIG. 7 shows the internal assembly of an optical hub 150according to an aspect of the invention. The mechanism 172, configured to support collection-mirror 20, is moved with lead screw 272 and electric motor 273. Fold-mirror carriage assembly 162 (shown here without fold-mirror 164 installed for clarity) is moved via a lead screw 262 and electric motor 263.

In a further aspect of the invention, light may be introduced from outside of the electron microscope 100 via the optical hub fold-mirror 164 and to the sample 30 by way of collection-mirror 20, or from other sources within the electron microscope 100. In this aspect of the invention, some light collected by the collection-mirror 20 emerging from sample 30 may include light emitted from active electronic devices, or light that is reflected, fluorescent, scattered, or wavelength-shifted from a light source incident on the sample 20.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. An apparatus for collection and analysis of light in an electron microscope comprising:
   a mechanism supporting a collection-mirror at a distal end, said mechanism configured to extend into a sample chamber of the electron microscope and to position said collection-mirror in proximity to a sample under analysis;
   said collection-mirror configured such that light collected by said collection-mirror forms a light-pattern that is collimated along a linear axis and light rays forming said light pattern are substantially parallel to one another;
   a first linear actuator having a carriage supporting a fold-mirror, said fold-mirror being located to receive the light directed by said collection-mirror;
   wherein said first linear actuator is configured to move said fold-mirror to a plurality of fixed locations, each of said fixed locations being associated with a set of optics or detectors arranged for analysis of the light.

2. The apparatus of claim 1, further comprising:
a movable optical filter assembly, said movable optical filter assembly being configured to move to said plurality of fixed locations in coordination with said fold-mirror.

3. The apparatus of claim 1, further comprising: an optical aperture or slit located in a portion of an optical instrument and wherein said fold-mirror is configured to direct a portion of said light-pattern through said aperture or slit.

4. The apparatus of claim 1, where said mechanism that supports a collection-mirror comprises a second linear actuator configured to position or move said collection-mirror to be adjusted over or under said sample under analysis.

5. The apparatus of claim 1, wherein the light collected by the collection-mirror is cathodoluminescence light or other light emerging from the sample including light emitted from active electronic devices, or light that is reflected, fluorescent, scattered, or wavelength-shifted from a light source incident on the sample.

6. The apparatus of claim 1, wherein said first linear actuator comprises a first lead screw and a first electric motor.

7. The apparatus of clam 4, wherein said second linear actuator comprises a second lead screw and second electric motor.

8. The apparatus of claim 2, further comprising:
a third linear actuator configured to position said filter assembly.

9. The apparatus of claim 2, wherein said optical filter assembly comprises a plurality of optical filters and an optical filter selection actuator configured to align one of said plurality of optical light filters with said fold-mirror.

10. The apparatus of claim 1, wherein said fold mirror is further configured to introduce of light into the electron microscope.

11. The apparatus of claim 1, further comprising:
a port adjuster configured to mount the apparatus to an electron microscope port and to adjust a position of an optical axis of collected light in one or more directions normal to the optic axis.

12. The apparatus of claim 2, further comprising:
an optical aperture or slit located in an optical instrument and wherein said fold-mirror is configured to position a portion of said light-pattern through said aperture or slit and wherein optical filters are positioned between said fold-mirror and said optical aperture or slit.

13. The apparatus of claim 1, wherein said mechanism supporting a collection-mirror at a distal end, said first linear actuator having a carriage supporting a fold-mirror, and said fold-mirror are all located within a low-pressure chamber that includes portions of the electron microscope.

14. The apparatus of claim 4, wherein said mechanism supporting a collection-mirror at a distal end, said first linear actuator having a carriage supporting a fold-mirror, said fold-mirror and said second linear actuator are all located within a vacuum chamber that includes portions of the electron microscope.

* * * * *

UNITED STATES PATENT AND TRADEMARK OFFICE
CERTIFICATE OF CORRECTION

PATENT NO. : 10,707,051 B2  
APPLICATION NO. : 16/408703  
DATED : July 7, 2020  
INVENTOR(S) : Hunt et al.

It is certified that error appears in the above-identified patent and that said Letters Patent is hereby corrected as shown below:

In the Claims

Column 6, Claim 10, Line 6, should be:
"further configured to introduce light into the electron"

Signed and Sealed this
Twenty-second Day of September, 2020

Andrei Iancu
*Director of the United States Patent and Trademark Office*